United States Patent [19]

Bornstein et al.

[11] Patent Number: 5,514,622

[45] Date of Patent: May 7, 1996

[54] METHOD FOR THE FORMATION OF INTERCONNECTS AND LANDING PADS HAVING A THIN, CONDUCTIVE FILM UNDERLYING THE PLUG OR AN ASSOCIATED CONTACT OF VIA HOLE

[75] Inventors: Johnathan G. Bornstein, Cupertino; Roger Caldwell, Milpitas, both of Calif.

[73] Assignee: Cypress Semiconductor Corporation, San Jose, Calif.

[21] Appl. No.: 297,626

[22] Filed: Aug. 29, 1994

[51] Int. Cl.$^6$ ............................................. H01L 21/283
[52] U.S. Cl. ..................... 437/189; 437/190; 437/192; 437/195
[58] Field of Search .................... 437/190, 192, 437/195, 246, 189; 156/643.1

[56] References Cited

U.S. PATENT DOCUMENTS

| | | | |
|---|---|---|---|
| 3,824,678 | 7/1974 | Harris et al. | |
| 4,624,864 | 11/1986 | Hartmann | 156/643 |
| 4,822,753 | 4/1989 | Pintchovski et al. | 437/192 |
| 4,920,071 | 4/1990 | Thomas | 437/188 |
| 4,933,743 | 6/1990 | Thomas et al. | 357/71 |
| 4,960,732 | 10/1990 | Dixit et al. | 437/192 |
| 5,000,818 | 3/1991 | Thomas et al. | 156/643 |
| 5,035,768 | 7/1991 | Mu et al. | 156/626 |
| 5,045,916 | 9/1991 | Vor et al. | 437/188 |
| 5,117,276 | 5/1992 | Thomas et al. | 357/71 |
| 5,183,782 | 2/1993 | Onishi et al. | 437/192 |
| 5,219,791 | 6/1993 | Freiberger | 437/195 |
| 5,219,793 | 6/1993 | Cooper et al. | 437/195 |
| 5,227,335 | 7/1993 | Holschwandner et al. | 437/192 |
| 5,260,233 | 11/1993 | Buti et al. | 437/195 |
| 5,286,518 | 2/1994 | Cain et al. | 427/96 |
| 5,286,674 | 2/1994 | Roth et al. | 437/190 |

FOREIGN PATENT DOCUMENTS

| | | | |
|---|---|---|---|
| 61-264378 | 11/1986 | Japan | 437/189 |
| 1-214137 | 8/1989 | Japan | 437/194 |

OTHER PUBLICATIONS

Bollinger et al., "An Advanced Four Level . . . ," Jun. 12–13, 1990, VMIC Conference, pp. 21–27.

Primary Examiner—T. N. Quach
Attorney, Agent, or Firm—Blakely, Sokoloff, Taylor & Zafman

[57] ABSTRACT

The present invention provides a method for the formation of interconnects and landing pads having a thin, conductive film underlying the plug of an associated contact or via hole. In accordance with the preferred embodiment of the present invention, a silicon substrate is provided having at least one device region formed at the surface of the substrate. An insulating layer is deposited over the substrate having at least one contact hole formed through the insulating layer to expose the device region. A first blanket layer of titanium is deposited as a tungsten adhesion layer over the insulating layer and the exposed device region within the contact hole. A second blanket layer of titanium-tungsten or titanium-nitride is then deposited as a tungsten barrier layer over the adhesion layer. Subsequently, a blanket contact plug layer comprising tungsten is deposited over the barrier layer by chemical vapor deposition. Both the contact plug layer and the barrier layer are then removed from the surface of the adhesion layer everywhere except within the contact hole by a selective etch back process wherein a selectivity between tungsten and titanium of at least 5:1 is achieved. Next, the exposed portions of the adhesion layer are patterned with a mask and etched to remove those portions of the adhesion layer not covered by the mask, thus converting the adhesion layer into a thin film interconnect or landing pad underlying the contact plug of the associated contact hole.

20 Claims, 3 Drawing Sheets

METHOD FOR THE FORMATION OF INTERCONNECTS AND LANDING PADS HAVING A THIN, CONDUCTIVE FILM UNDERLYING THE PLUG OR AN ASSOCIATED CONTACT OF VIA HOLE

BACKGROUND OF THE INVENTION (1) Field of the Invention

The present invention relates to the field of fabricating semiconductor devices, and more particularly, to making electrical contacts to semiconductor device regions and interlayer interconnects.

(2) Prior Art

In the fabrication of integrated circuits, it is often desired to etch certain areas of a dielectric or insulating film (i.e., $SiO_2$) formed over a semiconductor substrate (i.e., Si) to create via or contact holes for electrically contacting certain regions of the device, such as the source and drain regions of a transistor. However, as the size of semiconductor device features are significantly reduced to meet the needs of today's very large scale integration (VLSI) technology, the problem of making reliable electrical contacts to the regions of the device through established via and contact holes is worsened.

Because the significant reduction in the size of the device features requires that the holes be positioned close together, be of small diameter and have steep vertical sidewalls, it has become difficult to deposit conventional materials (i.e., aluminum) in the holes such that a uniform contact with the underlying conductive region or layer is established and no breaks occur in the interconnect metalization at the edges of the holes. As shown in FIG. 1(a), this is partially overcome in the prior art by filling, for example, the contact holes (either selectively or not) with a separate plug fill material such as tungsten and then depositing an aluminum metalization over the plug to form an interconnect or landing pad (see for example U.S. Pat. Nos. 4,822,753 and 4,960,732). In this manner, the aluminum interconnect or landing pad does not traverse the acute edge of the contact hole where electrical breaks are likely to occur during formation of the interconnect.

According to more recent methods designed to eliminate the problem of tungsten not adhering to silicon dioxide, a tungsten plug fill material is deposited as a blanket layer over an underlying conductive film (e.g., titanium, titanium-nitride, titanium-tungsten, etc.) which serves as an adhesion layer for the adhesion of tungsten to the silicon dioxide insulating layer (see FIG. 1(b)). Following etch-back of the tungsten blanket layer, an additional conductive layer (e.g., titanium, titanium-nitride, titanium-tungsten, aluminum, etc.) is applied over the plug and is subsequently patterned and etched leaving an interconnect between via plugs and/or a landing pad layer for a subsequent overlying via. Using this conventional method, however, forces the conduction path of the interconnect or landing pad to cross two interfaces through the via, namely (i) the interface between the interconnect and the plug; and (ii) the interface between the plug and the adhesion layer. These interfaces, which are depicted as Interfaces #1 and #2 in FIG. 1(b), will result in an increased resistance of the electrical contacts, thereby reducing the speed of the semiconductor device.

Another disadvantage with the above method is that enclosure or coverage of the contact or via hole by the interconnect or landing pad is dependent upon their alignment to the hole during patterning using a masking layer such as a photoresist. If the masking layer is not properly aligned with the hole, partial enclosure, or perhaps even complete non-enclosure of the hole will result, again causing the resistance of the contact to substantially increase or a complete failure of the electrical contact.

Another method designed to overcome the above-noted problems is the use of tungsten for both the plug fill material and the interconnect wiring layer, with the plug and wiring layer being formed through chemical vapor deposition (CVD) or bias sputtering and an etch back step (see for example U.S. Pat. Nos. 4,960,732 and 5,183,782). Since modern tungsten deposition techniques overcome the problem of electrical breaks forming at the edges of the hole, the blanket layer of tungsten overlying the insulating (or other adhesive and/or barrier) layers can simply be patterned and etched to form the electrical wiring associated with the plug of the hole. This combined plug and interconnect structure eliminates the interfaces described above in addition to alleviating the alignment-dependency problem. Yet, the use of tungsten itself as the interconnect layer introduces an additional planarity problem due to the formation of an interconnect having rather large step features at its edges. This arises from the fact that a significant amount of Tungsten must be deposited over the entire surface of the semiconductor to ensure that the hole is completely filled, but this also results in a significant increase in the thickness of the interconnect portion itself.

Yet another prior art method, which is designed to avoid the problems of encroachment at the silicon-to-silicon dioxide interface, worm hole damage to the underlying silicon and the line electromigration susceptibility of aluminum interconnects, is described in U.S. Pat. No. 4,960,732. According to that reference, an adhesion layer comprising Titanium is first deposited within a contact hole followed by a barrier layer of a refractory metal that acts as a barrier to silicon diffusion. After an annealing step, Tungsten is then deposited or sputtered on the surface of the device and removed from everywhere expect within the contact hole by use of an etch back step. The etch back step is selective with respect to the barrier layer such that both the adhesion and barrier layers remain on the silicon dioxide surface. A subsequent overlying aluminum metalization step in addition to both a patterning step and etch back step are then used to form an interconnect comprising the aluminum layer and both the adhesion and barrier layers for electrically contacting the tungsten plug within the contact hole.

Although the formation of the above-described interconnect structure resolves many of the prior art problems, it still does not satisfactorily resolve the electrical interface barrier and planarity problems set forth above. Because this interconnect actually forms a three level structure comprising the adhesion layer, the barrier layer and the aluminum layer, two electrical interface barriers still exist as shown in FIG. 1(c), thereby resulting in slower device speeds. Additionally, aside from the fact that this three tiered structure also increases the required number of process steps, it further increases the total thickness of the interconnect, which is approximately 2300 angstroms. With an interconnect of such thickness, the poor step coverage that results from the formation of additional overlying layers causes a loss of planarity in the semiconductor. This may then require the inclusion of further planarization steps (i.e., polishing) in order to reduce its thickness to within a range acceptable for use of high numerical aperture lithography.

SUMMARY OF THE INVENTION

It is therefore an object of the present invention to provide a method, and a semiconductor device structure resulting therefrom, for forming interconnects and landing pads having a thin, conductive film underlying the plug of an associated contact or via hole which avoid the above-mentioned prior art problems.

It is another object of the present invention to provide a method, and a semiconductor device structure resulting therefrom, for forming interconnects and landing pads which are directly coupled to an conductive region or layer underlying the plug of a contact or via hole so as to eliminate electrical interface barriers and increase device speeds.

It is a further object of the present invention to provide a simplified method for forming interconnects and landing pads from a tungsten adhesion layer underlying a tungsten contact plug of a contact hole, the tungsten adhesion layer comprising a thin, conductive film for maintaining the planarity of the semiconductor device.

These and other objects are accomplished in accordance with the preferred embodiment of the present invention by first providing a silicon substrate having at least one device region formed at the surface of the substrate. An insulating layer is deposited over the substrate having at least one contact hole formed through the insulating layer to expose the device region. A first blanket layer of titanium is deposited as a tungsten adhesion layer over the insulating layer and the exposed device region within the contact hole, this adhesion layer being formed to a thickness of approximately 1,400 Angstroms. A second blanket layer of titanium-tungsten or titanium-nitride is then deposited as a tungsten barrier layer over the adhesion layer. This barrier layer preferably comprises a thickness of approximately 800 Angstroms. Subsequently, a blanket contact plug layer comprising tungsten is deposited to a preferred thickness of approximately 8,000 Angstroms over the barrier layer by chemical vapor deposition.

Both the contact plug layer and the barrier layer are then removed from the surface of the adhesion layer everywhere except within the contact hole by a selective etch back process wherein a selectivity between tungsten and titanium of at least 5:1 is achieved. This is accomplished by use of a SF6 gas chemistry and etch parameters comprising a gas flow of 100 to 300 sccm, a chamber pressure of 200 to 400 mTorr, a 13.56 RF power of 350 to 550 Watts and a chamber temperature of 30° to 50° Celsius.

Next, the exposed portions of the adhesion layer are patterned with a mask and etched to remove those portions of the adhesion layer not covered by the mask, thus converting the adhesion layer into a thin film interconnect or landing pad having a thickness of approximately 1,000 Angstroms and underlying the contact plug of the associated contact hole.

Due to the significant reduction in the thickness of the interconnect or landing pad resulting from the method of the present invention, the planarity of the resulting semiconductor device structure is significantly improved over that of the prior art. Furthermore, the interconnect or landing pad of the present invention eliminates the electrical interfaces described above and the problems associated with non-enclosure of the hole due to the provision of an electrical conductance path which both directly contacts the underlying conductive regions (or layers) and extends beyond the perimeter of the holes on the insulating layer. Finally, the method of the present invention has the further benefit of attaining the above-objects with a reduced number of process steps, thus reducing the cost of the resulting device.

BRIEF DESCRIPTION OF THE DRAWINGS

The objects, features and advantages of the present invention will become apparent from the following detailed description in which.

DETAILED DESCRIPTION OF THE INVENTION

A method for the formation of interconnects and landing pads for improving electrical contacts to conductive regions or layers underlying contact and via holes is described. In the following description, numerous details such as specific materials, chemicals, process parameters and techniques are set forth in order to provide a more thorough understanding of the present invention. It will be obvious, however, to those skilled in the art, that the present invention can be practiced without many of these specific details. In other instances, well-known processes, etch equipment and the like are not described in detail in order not to obscure the description of the present invention.

Figure 1A:
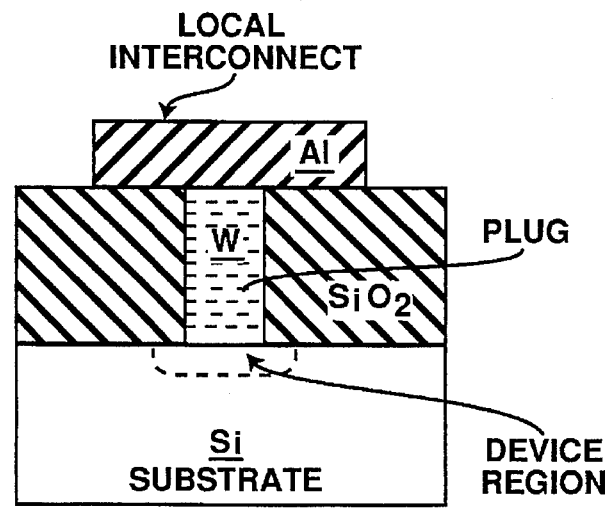
FIG. 1(a) illustrates a cross-sectional view of a first prior art semiconductor device.
Figure 1B:
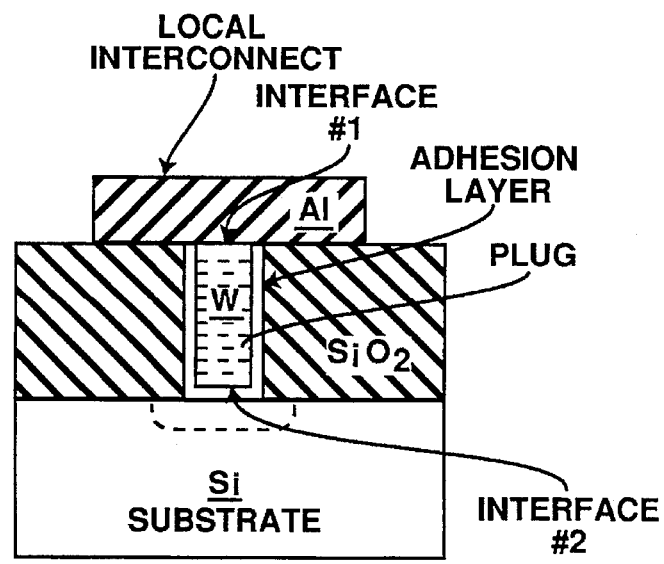
FIG. 1(b) illustrates a cross-sectional view of a second prior art semiconductor device.
Figure 1C:
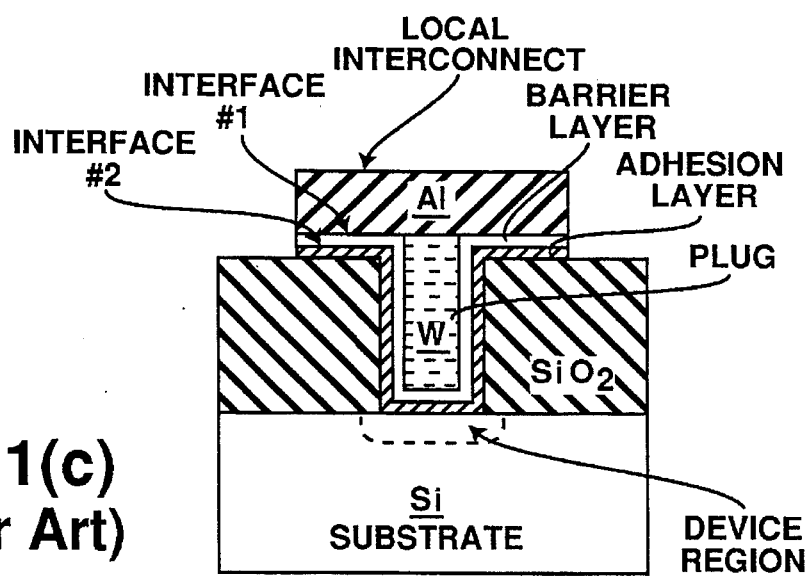
FIG. 1(c) illustrates a cross-sectional view of a third prior art semiconductor device.
Figure 2A:
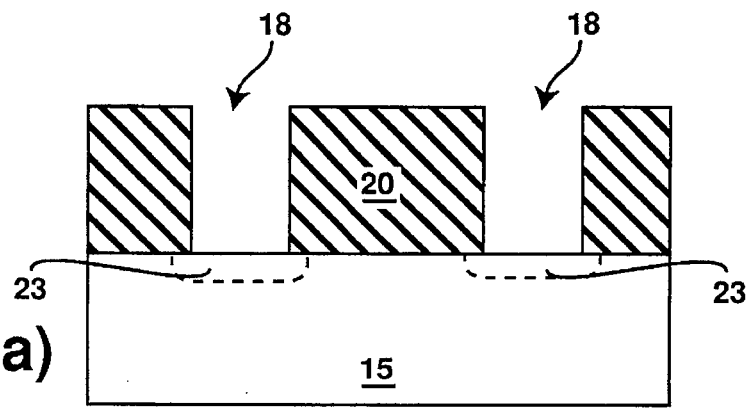
FIG. 2(a) illustrates a cross-sectional view of the semiconductor device of the present invention after etching of a contact hole through an insulating layer.

In the formation of a first layer interconnect in accordance with the present invention, a semiconductor substrate 15 (i.e., Si) is provided in which a number of device regions 23 are created by diffusion, ion implantation and the like. An insulating layer 20 (i.e., $SiO_2$) is formed over the substrate 15 and etched so as to form a plurality of contact holes 18, shown in FIG. 2(a), which allow electrical contact to be made with the device regions 23 of the substrate 15.

Figure 2B:
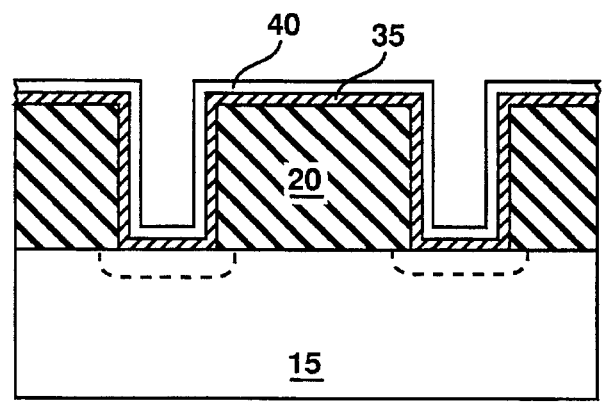
FIG. 2(b) illustrates a cross-sectional view of the semiconductor device of the present invention after formation of the first adhesion layer and the second barrier layer through sputtering.
Figure 3:
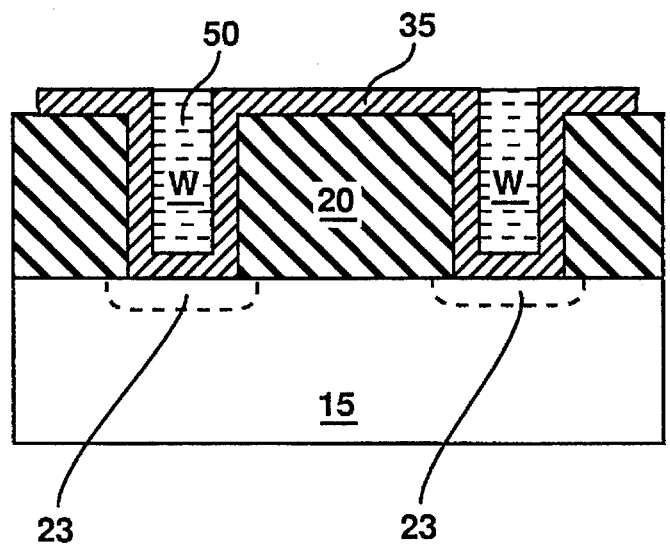
FIG. 3 illustrates a cross-sectional view of a finished semiconductor device of the present invention comprising an interconnect in which only the first adhesion layer is formed below the plug fill material.

As shown in FIG. 2(b), a first, conductive layer 35 is conformally deposited over the insulating layer 20 and into the previously formed contact holes 18 where the underlying device regions 23 have been exposed. This first layer 35 preferably forms an adhesion layer of titanium or titanium-tungsten when used in conjunction with a tungsten contact plug 50, however, in other embodiments, it may also comprise aluminum, copper, tantalum, chromium, cobalt, platinum or molybdenum. Again shown in FIG. 2(b), a second, conductive layer 40 comprising titanium-tungsten or titanium-nitride for use as a tungsten barrier layer in the preferred embodiment is then conformally deposited over the first layer 35. In accordance with an alternate embodiment shown in FIG. 3, however, this second barrier layer 40 need not be used in the present invention so as to thereby save an additional deposition step in the method.

Figure 2C:
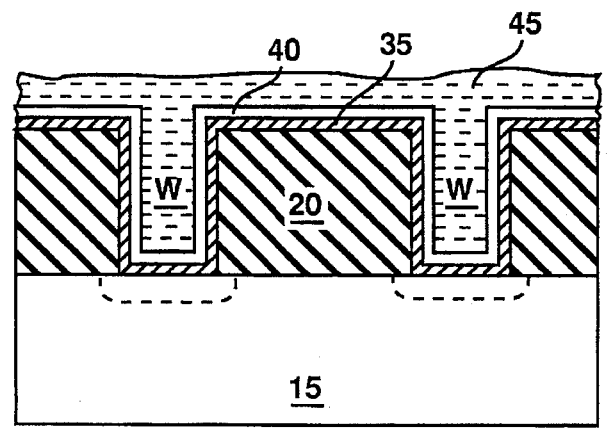
FIG. 2(c) illustrates a cross-sectional view of the semiconductor device of the present invention after blanket deposition of a plug fill material.
Figure 2D:
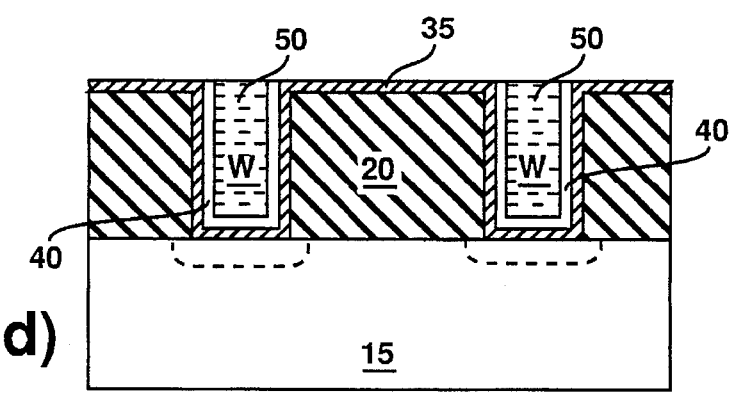
FIG. 2(d) illustrates a cross-sectional view of a finished semiconductor device of the present invention after the etch back step in which the excess plug fill material and the second barrier layer are removed from the surface of the insulating layer to leave the first adhesion layer as the interconnect.

Next, a blanket film 45 of a plug fill material, which preferably comprises tungsten (but may alternately comprise aluminum in other embodiments), is then applied over the entire surface of the second layer 40 as shown in FIG. 2(c). Referring to FIG. 2(d), a selective dry etch back step is utilized to remove the plug fill material 45 and the second layer 40 everywhere except from the filled contact holes 18, leaving the underlying first layer 35 fully intact over the insulating layer 20 and leaving both the first and second layers 35, 40 beneath the plug fill material 45 within the contact holes 18. The first layer 35 is then patterned by means of a photoresist mask or the like and etched so as to form the desired interconnect or landing pad pattern on the surface of the insulating layer 20 (not shown).

Figure 4:
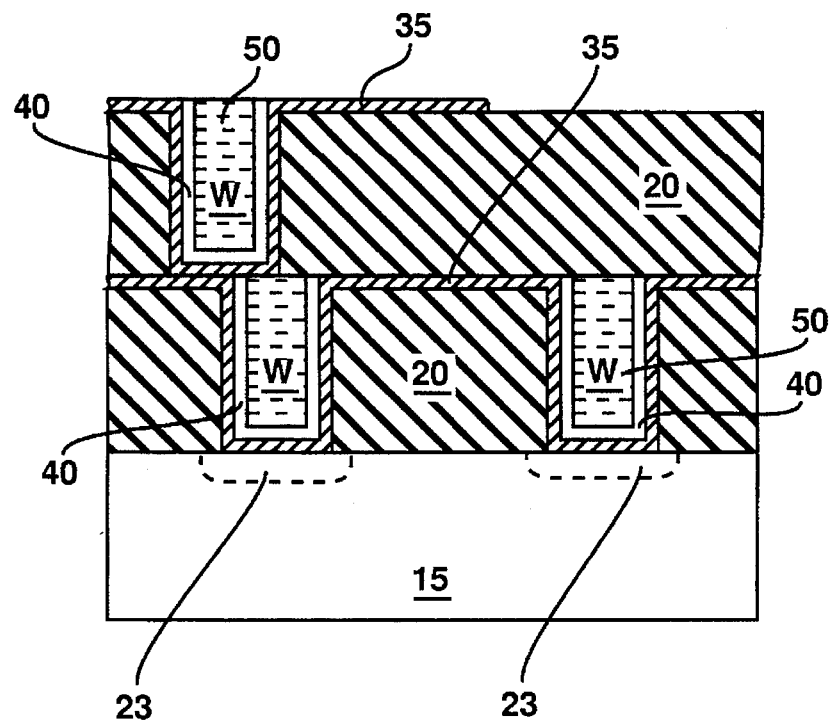
FIG. 4 illustrates a cross-sectional view of a finished semiconductor device of the present invention comprising a landing pad in which both the first adhesion layer and the second barrier layer are formed below the plug fill material.

With reference to the interconnect shown in FIG. 2(d) and the landing pad shown in FIG. 4, the resulting device structure of the present invention is quite different from and provide unforeseen advantages over the prior art. First, the interconnect/landing pad resulting from the method of the present invention consists solely of a thin conductive film 35 having a thickness (as will be described below) of approximately 1000 angstroms such that the step coverage of subsequently formed layers will not interfere with the planarity limitations of the semiconductor device. Second, the electrical interface barriers referred to in the background section have been eliminated due to the fact that an electrical conductance path is now provided directly from the device regions at the bottom of the contact hole 18 to other adjacent interconnects, or alternatively, to another overlying via when used as a landing pad. Third, the number of process steps undertaken to form the interconnect or landing pad of the present invention are reduced by at least two since, in contrast to the prior art, no separate metalization, patterning and etching of an aluminum interconnect is now required.

As a specific example of the above-described method and structure, silicon dioxide is first deposited using plasma deposition equipment to a thickness of 5000–10,000 angstroms. Contact holes 18 are patterned using conventional photolithography techniques, with the contact hole 18 feature size ranging from 0.5–1.0 micron in diameter. The contact holes 18 are then etched using conventional dry plasma etching equipment, leaving contact hole wall profiles ranging from 80–90 degrees.

A Titanium adhesion layer 35 is sputtered using low pressure sputtering equipment to a preferred thickness of 1400 angstroms, although its thickness may range between 500 and 2000 angstroms. A Titanium-Tungsten barrier layer 40, which in the preferred embodiment comprises 90% Tungsten and 10% Titanium, is sputtered using conventional low pressure sputtering equipment to a preferred thickness of 800 angstroms, although its thickness may range between 100 and 1000 angstroms. A Tungsten plug fill material 45 is then deposited using a conventional Tungsten CVD reactor with a decomposition of WF6 to a preferred thickness of 8000 angstroms, although its thickness may range between 5,000 and 10,000 angstroms.

Next, the Tungsten is etched using tungsten etching equipment, such as a Lam Research Model 4600 tungsten etching machine. A fluorinated etch chemistry, such as $SF_6$ gas, is used to obtain a selectivity of tungsten to titanium of at least 5:1. This type of selectivity can be obtained in the etching machine with a gas flow of 100 to 300 sccm, a chamber pressure of 200 to 400 mTorr, a 13.56 MHz RF power of 350 to 550 Watts and a chamber temperature of 30° to 50° C. The etch is performed with a time duration such that both the excess plug fill material 45 and the barrier layer 40 overlying the insulating layer 20 are removed, with the etch removing approximately 100 to 500 angstroms of the adhesion layer 35 to form a blanket layer having a resulting preferred thickness of approximately 1000 angstroms.

The remaining adhesion blanket layer 35 is then patterned using standard photolithography techniques with an interconnect mask pattern. After the resist is patterned, this layer is finally etched using conventional plasma etching equipment to form the interconnect of the present invention.

Although the materials for the first, second and contact plug layers 35, 40, 45 set forth above are in accordance with the preferred embodiment, the interconnect/landing pad of the present invention may also be formed with other combinations of materials, examples of which are shown in Table I below. The composition of the first layer, however, should be selected such that the first layer will not be significantly etched in a tungsten etch chemistry.

TABLE I

| First Layer  | Ti | Ti | Al | Cu | Ta | Cr | Co | Pt | Mo |
|---|---|---|---|---|---|---|---|---|---|
| Second Layer | . . . . . . TiW or TiN . . . . . . | | | | | | | | |
| Plug Layer   | W  | Al | W  | W  | W  | W  | W  | W  | W  |

While the present invention has been described in conjunction with the preferred embodiment, it is evident that numerous alternatives, depictions, variations and uses will be apparent to those skilled in the art in light of the foregoing description. It will therefore be appreciated that the breadth of the present invention should be defined with respect to the claims which follow.

We claim:

1. A method for electrically contacting conductive regions of a semiconductor device comprising the steps of:

providing one of a silicon substrate and an overlying insulating layer formed above a substrate having a conductive region formed at the surface thereof, the conductive region comprising one of an electrical device region formed within a substrate and an electrical contact layer formed over an overlying insulating layer;

forming a first insulating layer overlying one of the substrate and the overlying insulating layer having at least one hole comprising one of a contact hole and a via hole formed through the insulating layer to expose the conductive region;

forming a first conductive blanket layer overlying the first insulating layer and the exposed conductive region within the hole;

forming a second conductive blanket layer overlying the first conductive blanket layer;

forming a blanket plug layer overlying the second conductive blanket layer;

etching the plug layer and the second conductive blanket layer in an etch process until the plug layer and the second conductive blanket layer are removed from everywhere on the surface of the first conductive blanket layer except within the hole;

patterning the first conductive blanket layer with a mask; and etching the first conductive blanket layer to remove those portions of the first conductive blanket layer not covered by the mask and leave the remaining portions of the first conductive blanket layer for use as a thin film electrical contact forming one of an interconnect and a landing pad.

2. The method of claim 1, wherein the plug layer comprises tungsten and the first conductive blanket layer comprises titanium as a tungsten adhesion material, the plug layer having a thickness between 5,000 and 10,000 Angstroms and the first conductive blanket layer having a thickness between 500 and 2,000 Angstroms.

3. The method of claim 2, wherein the step of etching the plug layer is performed by selectively etching the plug layer with a fluorinated etch chemistry and etch parameters chosen to achieve a selectivity between tungsten and titanium of at least 5:1.

4. The method of claim 3, wherein the step of selectively etching the plug layer is performed in a tungsten etching machine with a gas chemistry of SF6 and etch parameters comprising a gas flow of 100 to 300 sccm, a chamber pressure of 200 to 400 mTorr, a 13.56 RF power of 350 to 550 Watts and a chamber temperature of 30° to 50° Celsius.

5. The method of claim 1, wherein the plug layer comprises a plug fill material selected from the group consisting of tungsten and aluminum, and the first conductive blanket layer comprises a material selected from the group consisting of titanium, aluminum, copper, tantalum, chromium, cobalt, platinum and molybdenum.

6. The method of claim 1, wherein the etch process of the step of etching the contact plug layer and the second conductive blanket layer comprises a fluorinated etch chemistry.

7. The method of claim 6, wherein the plug layer comprises a plug fill material selected from the group consisting of tungsten and aluminum, the first conductive blanket layer comprises a material selected from the group consisting of titanium, titanium-tungsten, aluminum, copper, tantalum, chromium, cobalt, platinum and molybdenum, and the second conductive blanket layer comprises a material selected from the group consisting of titanium-tungsten and titanium-nitride.

8. A method for the formation of interconnects and landing pads comprising the steps of:

providing one of a silicon substrate and an overlying insulating layer formed above a substrate having a conductive region formed at the surface thereof, the conductive region comprising one of an electrical device region formed within a substrate and an electrical contact layer formed over an overlying insulating layer;

forming a first insulating layer overlying one of the substrate and the overlying insulating layer having at least one hole formed in the first insulating layer comprising one of a contact hole and a via hole formed through the insulating layer to expose the conductive region;

forming a first blanket layer as a tungsten adhesion layer comprising titanium overlying the first insulating layer and the exposed conductive region within the hole, the tungsten adhesion layer having a thickness of between 500 and 2,000 Angstroms;

forming a second blanket layer as a tungsten barrier layer comprising one of titanium-tungsten and titanium-nitride overlying the adhesion layer, the tungsten barrier layer having a thickness of between 100 and 1,000 Angstroms;

forming a blanket plug layer comprising tungsten overlying the barrier layer, the plug layer having a thickness of between 5,000 and 10,000 Angstroms;

selectively etching the plug layer and the barrier layer in a tungsten etching machine until both the plug layer and the barrier layer are removed from the surface of the adhesion layer everywhere except within the hole, the etch having a selectivity between tungsten and titanium of approximately 5:1 by use of a SF6 gas chemistry and etch parameters comprising a gas flow of 100 to 300 sccm, a chamber pressure of 200 to 400 mTorr, a 13.56 RF power of 350 to 550 Watts and a chamber temperature of 30° to 50° Celsius;

patterning an exposed portion of the adhesion layer with a mask; and etching the exposed portion of the adhesion layer in a plasma etch chamber to remove those portions of the adhesion layer not covered by the mask and form one of an interconnect and a landing pad making contact to the plug layer within the hole.

9. The method of claim 10, wherein the step of forming a first blanket layer as a tungsten adhesion layer is performed by one of chemical vapor deposition and sputtering of the tungsten adhesion layer on the insulating layer to a thickness of approximately 1400 Angstroms.

10. The method of claim 9, wherein the step of forming a second blanket layer as a tungsten barrier layer is performed by one of chemical vapor deposition and sputtering of the tungsten barrier layer on the tungsten adhesion layer to a thickness of approximately 800 Angstroms.

11. The method of claim 10, wherein the step of forming a blanket plug layer comprising tungsten is performed by chemical vapor deposition of tungsten on the tungsten barrier layer to a thickness of approximately 8000 Angstroms.

12. The method of claim 8, wherein the tungsten adhesion layer further comprises a material selected from the group consisting of aluminum, copper and tantalum.

13. The method of claim 8, wherein the tungsten barrier layer comprises titanium-tungsten having a composition of 10% titanium and 90% tungsten.

14. A method for electrically contacting conductive regions of a semiconductor device comprising the steps of:

providing one of a silicon substrate and an overlying insulating layer formed above a substrate having a conductive region formed at the surface thereof, the conductive region comprising one of an electrical device region formed within a substrate and an electrical contact layer formed over an overlying insulating layer;

forming a first insulating layer overlying one of the substrate and the overlying insulating layer having at least one hole comprising one of a contact hole and a via hole formed through the insulating layer to expose the conductive region;

forming a first conductive blanket layer overlying the first insulating layer and the exposed conductive region within the hole, the first conductive blanket layer comprising a material selected from the group consisting of titanium, titanium-tungsten, copper, tantalum, chromium, cobalt, platinum, and molybdenum;

forming a second conductive blanket layer overlying the first conductive blanket layer;

forming a blanket plug layer overlying the first conductive blanket layer;

etching the plug layer in an etch process until the plug layer is removed from everywhere on the surface of the first conductive blanket layer except within the hole;

patterning the first conductive blanket layer with a mask; and etching the first conductive blanket layer to remove those portions of the first conductive blanket layer not covered by the mask and leave the remaining portions of the first conductive blanket layer for use as a thin film electrical contact forming one of an interconnect and a landing pad, the first conductive blanket layer forming the sole conductive layer of the one of the interconnect and the landing pad, wherein the etch process of the step of etching the contact plug layer comprises a fluorinated etch chemistry, and further comprises etching the second conductive blanket layer until the second conductive blanket layer is removed from the surface of the first conductive blanket layer except within the hole.

15. The method of claim 14, wherein the plug layer comprises tungsten and the first conductive blanket layer comprises titanium as a tungsten adhesion material, the plug layer having a thickness between 5,000 and 10,000 Angstroms and the first conductive blanket layer having a thickness between 500 and 2,000 Angstroms.

16. The method of claim 15, wherein the step of etching the plug layer is performed by selectively etching the plug layer with a fluorinated etch chemistry and etch parameters chosen to achieve a selectivity between tungsten and titanium of at least 5:1.

17. The method of claim 16, wherein the step of selectively etching the plug layer is performed in a tungsten etching machine with a gas chemistry of SF6 and etch parameters comprising a gas flow of 100 to 300 sccm, a chamber pressure of 200 to 400 mTorr, a 13.56 RF power of 350 to 550 Watts and a chamber temperature of 30° to 509° Celsius.

18. The method of claim 14, wherein the plug layer comprises a plug fill material selected from the group consisting of tungsten and aluminum.

19. The method of claim 14, wherein the plug layer comprises a plug fill material selected from the group consisting of tungsten and aluminum, and the second conductive blanket layer comprises a material selected from the group consisting of titanium-tungsten and titanium-nitride.

20. The method of claim 14, wherein the step of etching the contact plug layer is performed in an etch process with a fluorinated etch chemistry having a selectivity of approximately 5:1 between tungsten and titanium.

\* \* \* \* \*